(12) United States Patent
Carpenter et al.

(10) Patent No.: US 9,684,019 B2
(45) Date of Patent: *Jun. 20, 2017

(54) WIRE MANAGEMENT METHOD WITH CURRENT AND VOLTAGE SENSING

(75) Inventors: Gary D. Carpenter, Austin, TX (US); Wael El-Essawy, Austin, TX (US); Thomas W. Keller, Jr., Austin, TX (US); Juan C. Rubio, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1374 days.

This patent is subject to a terminal disclaimer.

(21) Appl. No.: 13/451,515

(22) Filed: Apr. 19, 2012

(65) Prior Publication Data

US 2012/0200285 A1 Aug. 9, 2012

Related U.S. Application Data

(63) Continuation of application No. 13/024,199, filed on Feb. 9, 2011.

(51) Int. Cl.
*G01R 21/133* (2006.01)

(52) U.S. Cl.
CPC .................... *G01R 21/133* (2013.01)

(58) Field of Classification Search
CPC .... G01R 15/202; G01R 21/06; G01R 15/142; G01R 15/207; G01R 1/22; G01R 15/16; G01R 1/04; H02H 1/0015

(Continued)

(56) References Cited

U.S. PATENT DOCUMENTS

| 4,005,380 A | 1/1977 | Heilmann et al. |
| 4,266,189 A | 5/1981 | Karlin et al. |

(Continued)

FOREIGN PATENT DOCUMENTS

| CN | 101329370 A | 12/2008 |
| CN | 201654106 U | 11/2010 |

(Continued)

OTHER PUBLICATIONS

Silicon Chip, "Compact 0-80A Automotive Ammeter", issue 165, pp. 1-12, downloaded from www.siliconchip.com.au/cms/A 03551/article.html Nov. 4, 2010, published Jun. 30, 2002.

(Continued)

*Primary Examiner* — Son Le
*Assistant Examiner* — Alesa Allgood
(74) *Attorney, Agent, or Firm* — Mitch Harris, Atty at Law, LLC; Andrew M. Harris; Mercedes L. Hobson (57) ABSTRACT

A wire management method using a wire manager including current sensing features provides input for power measurement and management systems. The wire manager may be a single wire or single bundle retaining device with a current sensor such as a hall effect sensor integrated therein, or may be a multi-wire management housing with multiple current sensing devices disposed inside for measuring the current through multiple wires. The wires may be multiple branch circuits in a power distribution panel or raceway, and the wire manager may be adapted for mounting in such a panel or raceway. Voltage sensing may also be incorporated within the sensors by providing an electrically conductive plate, wire or other element that capacitively couples to the corresponding wire.

6 Claims, 6 Drawing Sheets

(58) Field of Classification Search
USPC ........ 324/117 R, 126, 117 H, 127, 658, 142; 702/64
See application file for complete search history.

(56) References Cited

U.S. PATENT DOCUMENTS

| | | | |
|---|---|---|---|
| 4,378,525 | A | 3/1983 | Burdick |
| 4,558,276 | A | 12/1985 | Comeau et al. |
| 5,436,427 | A * | 7/1995 | Bourque ............... B23K 9/1043 219/130.01 |
| 5,473,244 | A | 12/1995 | Libove et al. |
| 5,610,512 | A | 3/1997 | Selcuk |
| 5,867,020 | A | 2/1999 | Moore et al. |
| 5,921,805 | A * | 7/1999 | Tabata ............... H01R 13/5804 439/457 |
| 6,008,634 | A | 12/1999 | Murofushi et al. |
| 6,414,474 | B1 * | 7/2002 | Gohara ............... G01R 15/207 324/117 H |
| 6,522,509 | B1 | 2/2003 | Engel et al. |
| 6,654,219 | B1 | 11/2003 | Romano et al. |
| 6,661,239 | B1 | 12/2003 | Ozick |
| 6,703,842 | B2 | 3/2004 | Itimura et al. |
| 6,708,126 | B2 | 3/2004 | Culler et al. |
| 6,825,649 | B2 | 11/2004 | Nakano |
| 6,940,291 | B1 | 9/2005 | Ozick |
| 7,068,045 | B2 | 6/2006 | Zuercher et al. |
| 7,098,644 | B1 | 8/2006 | Denison |
| 7,148,675 | B2 | 12/2006 | Itoh |
| 7,227,348 | B2 | 6/2007 | Sorensen |
| 7,230,413 | B2 | 6/2007 | Zhang et al. |
| 7,265,533 | B2 | 9/2007 | Lightbody et al. |
| 7,315,161 | B2 | 1/2008 | Zribi et al. |
| 7,330,022 | B2 | 2/2008 | Bowman et al. |
| 7,474,088 | B2 | 1/2009 | Bowman et al. |
| 7,493,222 | B2 | 2/2009 | Bruno |
| 7,546,214 | B2 | 6/2009 | Rivers, Jr. et al. |
| 7,622,912 | B1 | 11/2009 | Adams et al. |
| 7,714,594 | B2 | 5/2010 | Ibuki et al. |
| 7,719,257 | B2 | 5/2010 | Robarge et al. |
| 7,719,258 | B2 | 5/2010 | Chen et al. |
| 7,847,543 | B2 | 12/2010 | Grno |
| 7,936,164 | B2 | 5/2011 | Doogue et al. |
| 7,990,133 | B2 | 8/2011 | Dockweiler |
| 2004/0227503 | A1 * | 11/2004 | Bowman ............... G01R 15/14 324/142 |
| 2004/0257061 | A1 | 12/2004 | George de Buda |
| 2005/0127895 | A1 | 6/2005 | Rittmann |
| 2005/0156587 | A1 | 7/2005 | Yakymyshyn et al. |
| 2006/0087777 | A1 | 4/2006 | Bruno |
| 2007/0058304 | A1 | 3/2007 | Parker et al. |
| 2008/0077336 | A1 | 3/2008 | Fernandes |
| 2008/0079437 | A1 | 4/2008 | Robarge et al. |
| 2009/0105973 | A1 | 4/2009 | Choi et al. |
| 2010/0001715 | A1 | 1/2010 | Doogue et al. |
| 2010/0198535 | A1 | 8/2010 | Brown et al. |
| 2010/0231198 | A1 | 9/2010 | Bose et al. |
| 2010/0264944 | A1 | 10/2010 | Rupert |
| 2010/0271037 | A1 | 10/2010 | Blakely |
| 2010/0283487 | A1 | 11/2010 | Juds et al. |
| 2011/0084688 | A1 | 4/2011 | Sorensen |
| 2012/0078680 | A1 | 3/2012 | Tharp |
| 2012/0200291 | A1 | 8/2012 | Carpenter et al. |
| 2012/0200293 | A1 | 8/2012 | Carpenter et al. |
| 2012/0203481 | A1 * | 8/2012 | Carpenter et al. .............. 702/62 |
| 2012/0319674 | A1 | 12/2012 | El-Essawy et al. |
| 2012/0319676 | A1 | 12/2012 | El-Essawy et al. |
| 2013/0099775 | A1 | 4/2013 | Mitsuya |
| 2014/0167787 | A1 | 6/2014 | Sanchez et al. |

FOREIGN PATENT DOCUMENTS

| | | |
|---|---|---|
| JP | 06174753 A | 6/1994 |
| JP | H09281146 A | 10/1997 |
| JP | 2003072484 A | 3/2003 |
| JP | 2006078316 | 3/2006 |
| JP | 2011149827 A | 8/2011 |
| JP | 2011237209 A | 11/2011 |
| TW | M386680 | 8/2010 |
| WO | WO2009042414 A2 | 4/2009 |

OTHER PUBLICATIONS

Silicon Chip, "Current Clamp Meter Adapter for DMMs", issue 180, published Sep. 12, 2003.

Ziegler, et al., "Current Sensing Techniques: A Review", IEEE Sensors Journal, Apr. 2009, pp. 354-376 vol. 9, No. 4. Piscataway, NJ.

McKenzie, et al. "Non-contact Voltage Measurement using Electronically Varying Capacitance", Electronics Letters, Feb. 4, 2010, vol. 46, No. 3, UK.

Final Office Action in U.S. Appl. No. 13/024,199 mailed on Jan. 15, 2015, 14 pages (pp. 1-14 in pdf).

U.S. Appl. No. 13/682,112, Nov. 20, 2012, Carpenter, et al.

U.S. Appl. No. 13/596,658, Aug. 28, 2012, El-Essawy, et al.

"AC Current sensor with Interface" downloaded from: http://www.electronicspoint.com/ac-current-sensor-interface-t221239.html on Jun. 10, 2011.

"Smart Current Signature Sensor" downloaded from http://technology.ksc.nasa.gov/successes/SS-Smart-Current-Signal-Snsr.htm on Jun. 10, 2011.

Dwyer, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 25, 2011.

Valuetesters.com on-line catalog: "non-contact voltage probes", downloaded from http://valuetesters.com/Voltage-Probe-Non-contact.php on May 25, 2011.

Office Action in U.S. Appl. No. 13/024,199 mailed on Jan. 8, 2014, 15 pages (pp. 1-15 in pdf).

Office Action in U.S. Appl. No. 13/024,199 mailed on May 19, 2015, 6 pages (pp. 1-6 in pdf).

Office Action in U.S. Appl. No. 13/024,199 mailed on May 17, 2016, 15 pages (pp. 1-15 in pdf).

Office Action in U.S. Appl. No. 13/024,199 mailed on Sep. 21, 2016, 5 pages (pp. 1-5 in pdf).

Notice of Allowance in U.S. Appl. No. 13/024,199 mailed on Oct. 20, 2016, 8 pages (pp. 1-8 in pdf).

* cited by examiner

WIRE MANAGEMENT METHOD WITH CURRENT AND VOLTAGE SENSING

The present U.S. patent application is a Continuation of U.S. patent application Ser. No. 13/024,199 filed on Jan. 9, 2011 and claims priority thereto under 35 U.S.C. §120.

BACKGROUND OF THE INVENTION

1. Field of the Invention

The present invention is related to wire managers for managing the position of one or multiple electrical wires, and more specifically to a wire manager including a current sensor that can be used to detect the current passing through a wire managed by the wire manager.

2. Description of Related Art

A need to measure power consumption in AC line powered systems is increasing due to a focus on energy efficiency for both commercial and residential locations. In order to measure power consumption of a circuit, the current drawn by the load must generally be measured, and for precise results, the characteristics of the load may also need to be known.

Adding current sensors to a power distribution system occupies space and adds complexity, and if a large number of circuits must be measured, increased installation difficulties and may cause disarray in the power distribution system.

Therefore, it would be desirable to provide a current sensing scheme that can provide isolated current draw information and optionally permit load characteristics to be taken into account, while providing organized and efficient installation with little additional space requirements for the power distribution system.

BRIEF SUMMARY OF THE INVENTION

The invention is embodied in a wire management method using a wire manager that includes a sensor for sensing a current passing through a wire and its method of operation. The wire manager may be a single wire manager that manages the position of one or more wires at a single position and measures a net current passing through the wires, or the wire manager may have multiple securing mechanisms for securing multiple wires with corresponding current sensors located at each wire. A voltage sensor may be incorporated within the sensor(s) for sensing an electric potential of the wire(s).

The wire manager may have a housing adapted for installation within a power distribution panel or raceway, and the securing mechanisms may be clamshell housings containing portions of a current sensor formed from a ferrite cylinder, which when closed around the wire, form either a complete ferrite cylinder, or one with a gap along the circumference in which a semiconductor magnetic field sensor may be inserted. The voltage sensor may be a cylindrical plate, a wire, a film, or other suitable conductive element for capacitively coupling to the wire in order to sense the electric potential of the wire. The voltage sensor may be located alongside the current sensing element, or within the current sensing element.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses wire managers having current sensing, and optionally voltage sensing, features for providing input to power measurement systems. For example, the present invention can provide input to power monitoring equipment in computer server rooms, in which multiple branch circuit distribute power to various electronic chassis power supplies, and in which it is beneficial to provide power usage information for the various branch circuits to power monitoring and/or system control utilities within a computer operating environment. Other applications include power monitoring for commercial and/or residential energy management.

Figure 1:
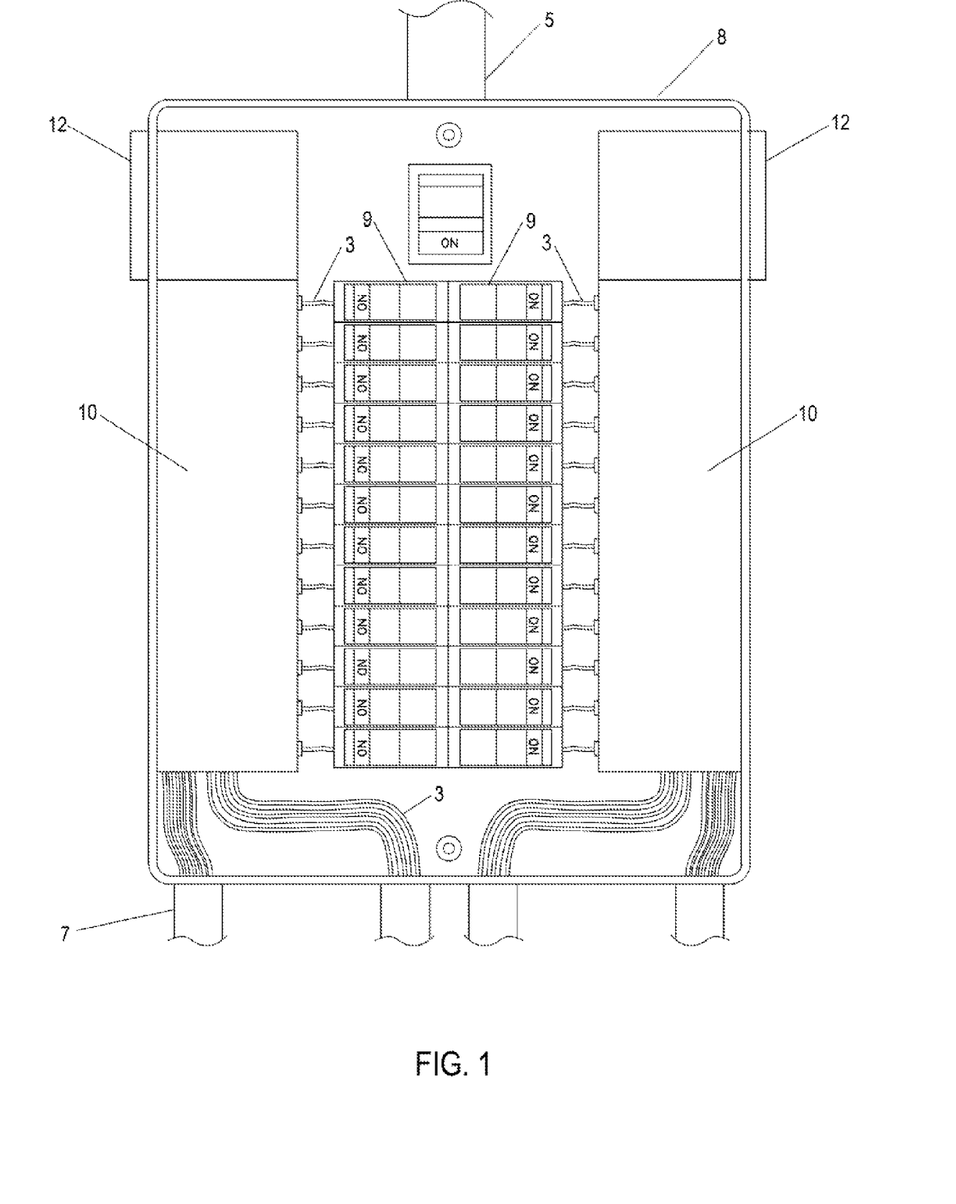
FIG. 1 is a pictorial diagram illustrating an electrical power distribution system including wire managers 10 according to an embodiment of the present invention.

Referring now to FIG. 1, a power distribution system in accordance with an embodiment of the present invention is shown. A power distribution panel 8 receives service entrance wiring 5 and distributes power to branch circuit wires 3 via circuit breakers 9. Branch circuit wires 3 are routed to supply power to loads via conduits or other raceways 7. Within power distribution panel 8, wire managers 10, in accordance with an embodiment of the invention, are installed. Wire managers 10 control the position of branch circuit wires 3 and further include sensing elements that are used to determine the current flowing through branch circuit wires 3 and optionally the magnitude and/or phase of the voltage on branch circuit wires 3 to provide for computation of the actual (complex) power delivered to the branch circuit loads. Wire managers 10 also include an interface/processing unit 12 that provides a wired or wireless interface to an external processing system and generally provides for computation of power usage-related information prior to transmission to the external processing system, although raw current (and optionally voltage) sensor output information could alternatively be transmitted, with computation of power usage-related information performed in the external processing system. Interface/processing unit 12 may alternatively be placed in locations and be dimensioned other than as shown. For example, interface/processing unit 12 may physically separate from wire manager 10 and be coupled to wire manager 10 by a wired, wireless, optical or other suitable interface.

Figure 2:
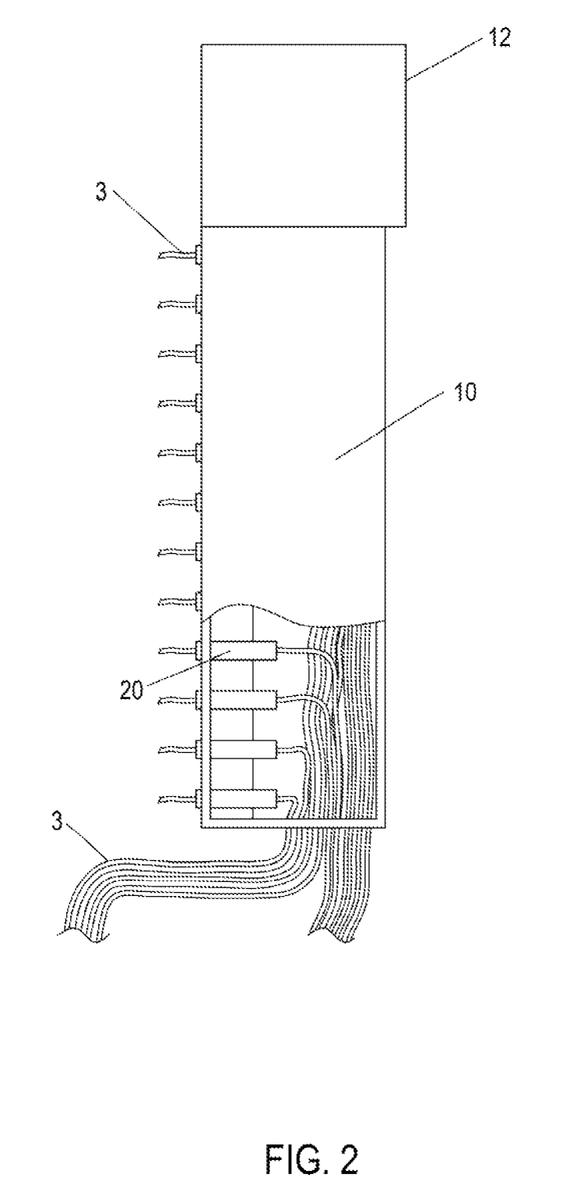
FIG. 2 is an illustration showing further details of wire manager 10.

Referring now to FIG. 2, details of wire manager 10 of FIG. 1 are shown. Branch circuit wires 3 are routed through a corresponding plurality of sensors 20 that provide at least an indication of a current flowing through the corresponding one of branch circuit wires 3, and optionally the voltage or phase of the voltage at the corresponding one of branch circuit wires 3. Details of sensors 20 will be described below in accordance with an exemplary embodiment of the invention, and further details of sensors 20, along with other sensors that may alternatively be used to implement sensors 20 are described in above-incorporated U.S. patent application "NON-CONTACT CURRENT AND VOLTAGE SENSOR."

Figure 3:
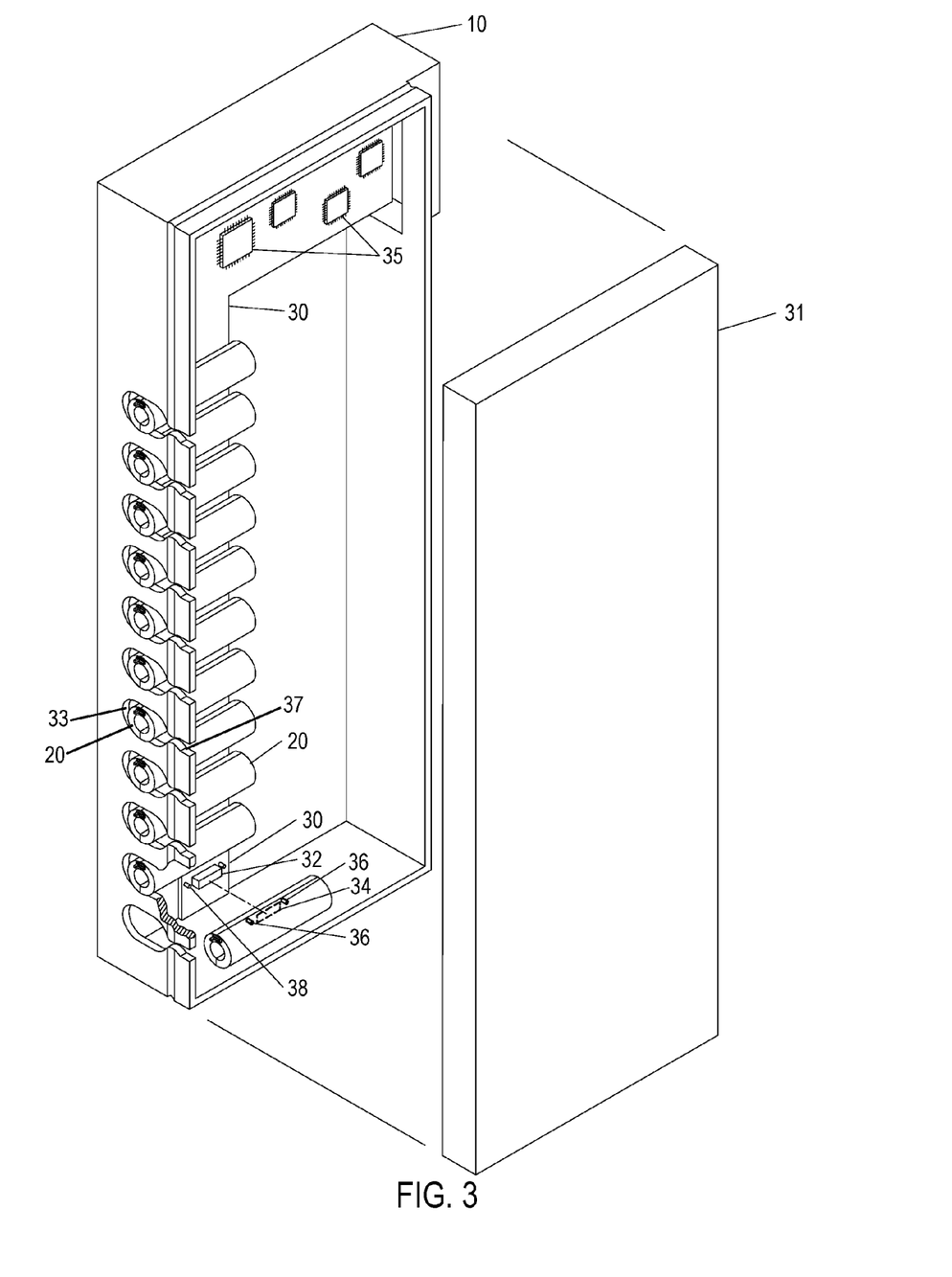
FIG. 3 is another illustration showing further details of wire manager 10.

Referring now to FIG. 3, further details of wire manager 10 of FIG. 1 are shown. Sensors 20 are fastened to a printed wiring board (PWB) 30, that provides connections from each of current sensing elements 32 to interface/processing unit 12, and also voltage sensing elements of sensors 20 if voltage sensing elements are provided. Interface/processing unit 12 includes integrated circuits 35 that implement power usage computations and information transmission, as well as signal processing to remove noise and properly scale the output(s) of sensors 20. As illustrated, current sensing elements 32 extend through apertures in sensors 20 when sensors 20 are mounted to PWB 30, and posts 38 may be provided to align and stabilize sensors 20 when sensors 20 are mounted to PWB 30 by mating posts 38 with recesses 36 in sensors 20. Attachment of sensors 20 may be made by any appropriate means, but some degree of flexibility should be provided so that excessive force is not applied to the mechanical connection between sensors 20 and PWB 30 when branch wires 3 are moved, so that the mechanical connection is not damaged. A soft-setting adhesive, flexible posts 36 either thermo-welded or chemically bonded, or snap-connected may be used. Alternatively, or in addition to the above, the outer body of current sensing elements 32 may be made to provide mechanical attachment to sensors 20. A cover 31 is provided to isolate circuits within wire manager 10 from the electrical circuits in the power distribution center or raceway in which wire manager 10 is installed. Cover 31 and the body of wire manager form an enclosure when fitted together form a housing that isolates the circuits within wire manager 10, and branch wires 3 extend through apertures 33 in the body of wire manager 10 and located at ends of sensors 20 and through which the ends of sensors 20 protrude as shown in FIG. 3, partially closing off apertures 33. Slots 37 are provided through the body of wire manager 10 for insertion of branch wires 3 so that branch wires 3 can be extended through wire manager 10 and secured by sensors 20.

Figure 4A:
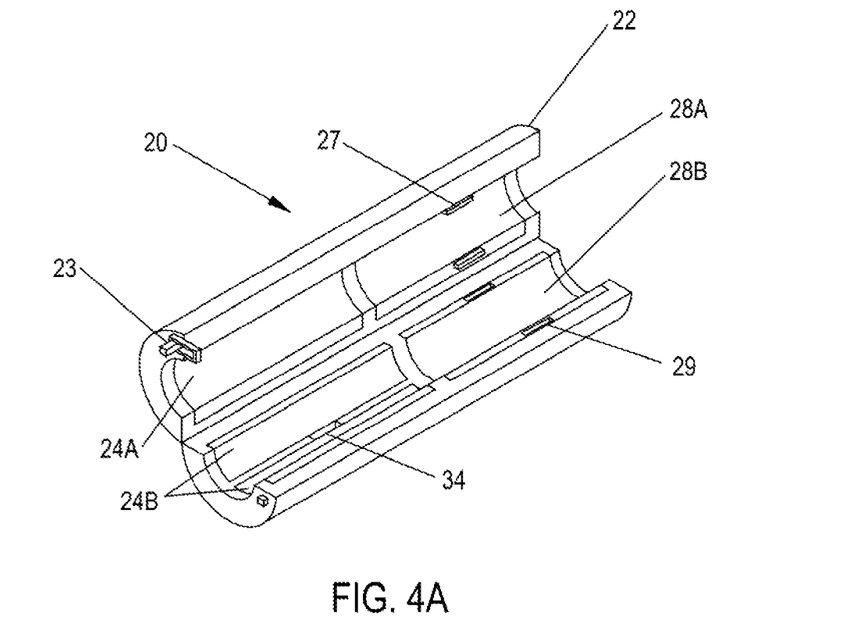
FIGS. 4A-4B are illustrations showing details of sensor 20 in accordance with an embodiment of the present invention.
Figure 4B:
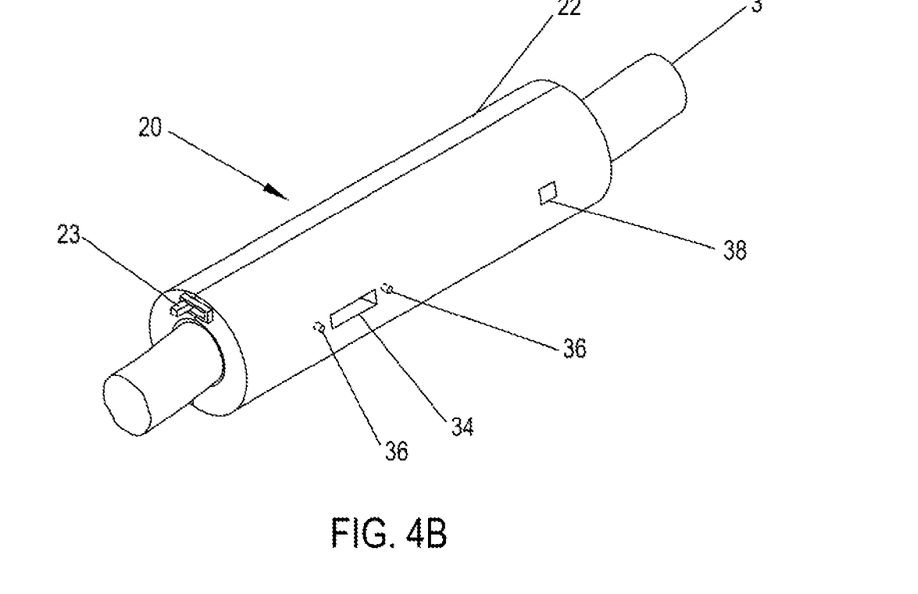

Referring now to FIG. 4A, details of sensor 20 of FIG. 3 are shown. A current sensing portion of sensor is formed by three ferrite pieces 24A, 24B that form a ferrite cylinder around one of branch circuit wires 3, when sensor body 22 is closed. Top ferrite piece 24A forms a half-cylinder, while ferrite pieces 24B define a gap between ferrite pieces 24B and in the circumference of the ferrite cylinder, in which current sensing element 32 of FIG. 3, which is generally a semiconductor magnetic field sensor, such as a Hall effect sensor, is disposed. An aperture 34 is formed through sensor body 22 for receiving current sensing element 32 as illustrated in FIG. 3. A voltage sensor formed by metal plates 28A, 28B provides capacitive coupling to branch circuit wire 3 that provides an AC waveform that is at least indicative of the phase of the voltage on branch circuit wire 3 and may be calibrated to provide an indication of the magnitude of the voltage if needed. Metal plate 28A includes a contact 27 and metal plate 28B includes a mating recess 29 to improve electrical contact between metal plates 28A and 28B, so that connection of one of metal plates 28A and 28B to the measurement system is needed to provide voltage sensing. A terminal 38 is provided on the bottom surface of sensor body 22 to provide an electrical connection from metal plate 28B to a PWB. A latching mechanism 23 is provided so that sensor body 22 is held in a closed position after clamping the sensor body 22 around branch circuit wire 3. A pair of recesses 36 may be provided for posts extending from a mounting surface, to stabilize and optionally snap-attach sensor body 22 to a PWB or other mounting surface.

Figure 5:
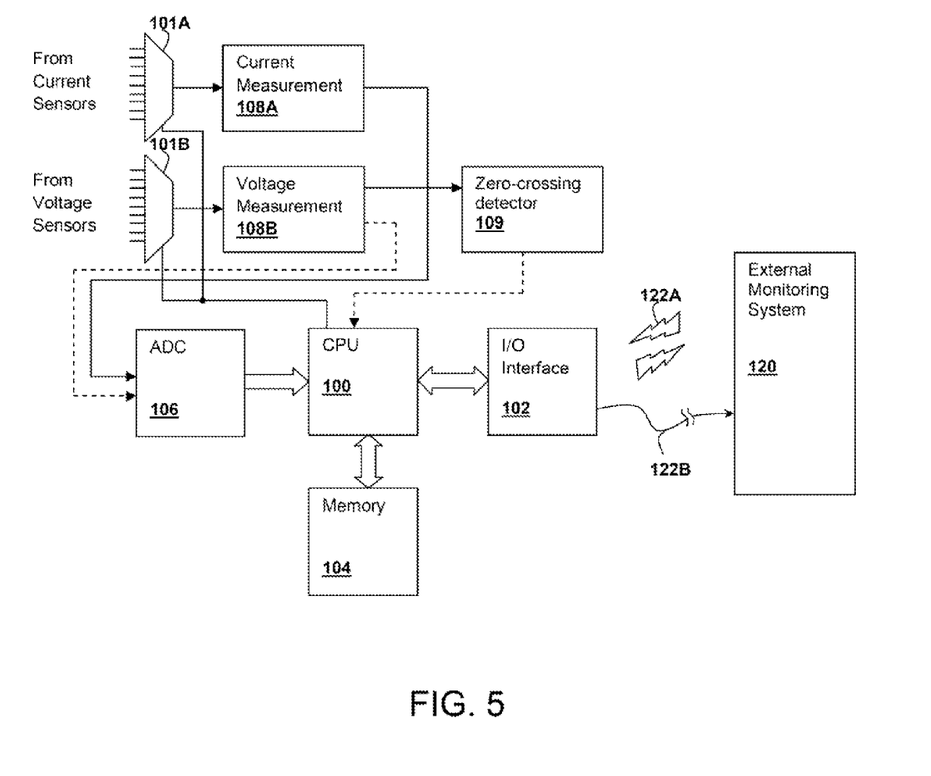
FIG. 5 is an electrical block diagram illustrating circuits within wire manager 10 according to an embodiment of the present invention.

Referring now to FIG. 5, details of interface/processing unit 12 of FIGS. 2 are shown. A multiplexer 101A receives signals from the individual current sensing elements within sensors 20 and selects a sensor for measurement, providing input to a current measurement circuit 108A, which is an analog circuit that appropriately scales and filters the current channel output of sensors 20. The output of current measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 104. Alternatively, a separate current measurement circuit 108A and multiplexer 101A may not be necessary, and sensors 20 may be coupled directly to ADC 106. The power usage by the branch circuit associated with a particular sensor can be determined by assuming that the branch circuit voltage is constant (e.g., 115 Vrms) and that the phase relationship between the voltage and current is aligned (i.e., in-phase). However, while the assumption of constant voltage is generally sufficient, as properly designed distribution systems do not let the line voltage sag more than a small amount, e.g., <3%, the phase relationship between voltage and current is dependent on the power factor of the load, and can vary widely and dynamically by load and over time. Therefore, it is generally desirable to at least know the phase relationship between the branch circuit voltage and current in order to accurately determine power usage by the branch circuit.

When voltage measurement is implemented, another multiplexer 101B is provided to receive signals from the individual voltage sensing elements in sensors 20 if voltage sensing is implemented. Multiplexer 101B receives signals from the individual voltage sensing elements within sensors 20 and selects a sensor for measurement, providing input to a voltage measurement circuit 108B, which is an analog circuit that appropriately scales and filters the voltage channel output of sensors 20. A zero-crossing detector 109 may be used to provide phase-only information to a central processing unit 100 that performs power calculations, alternatively or in combination with providing an output of voltage measurement circuit to an input of ADC 106. Alternatively, multiplexor 101B may not be necessary and one or more voltage sensor outputs of sensors 20 may be connected directly to ADC 106. In particular, it may not be necessary to make voltage measurements at each of sensors, for example, when sensing the phase of the voltage, a single measurement may suffice for providing a phase reference that is then used to determine the voltage-to-current phase difference for multiple branch circuits. Further, if multiple voltage measurements are taken, they voltage measurements may be used as an absolute voltage measurement, or the amplitude may be scaled to a known peak, r.m.s. or average value. An input/output (I/O) interface 102 provides either a wireless or wired connection to an external monitoring system, such as a wireless local area network (WLAN) connection 122A or wired Ethernet connection 122B. When power factor is not taken into account, the instantaneous power used by each branch circuit can be approximated as:

$$P_{BRANCH} = V_{rms} * I_{meas}$$

where $V_{rms}$ is a constant value, e.g. 115V and $I_{meas}$ is a measured rms current value. Power value $P_{BRANCH}$ may be integrated over time to yield the energy use. When the phase of the voltage is known, then the power may be computed more accurately as:

$$P_{BRANCH} = V_{rms} * I_{meas} * \cos(\Phi)$$

where ($\Phi$) is a difference in phase angle between the voltage and current waveforms. The output of zero-crossing detector 109 may be compared with the position of the zero crossings in the current waveform generated by current measurement circuit 108A and the time $\Delta T$ between the zero crossings in the current and voltage used to generate phase difference $\Phi$ from the line frequency (assuming the line frequency is 60 Hz):

$$\Phi = 2\Pi * 60 * \Delta T$$

In general, the current waveform is not truly sinusoidal and the above approximation may not yield sufficiently accurate results. A more accurate method is to multiply current and voltage samples measured at a sampling rate much higher than the line frequency. The sampled values thus approximate instantaneous values of the current and voltage waveforms and the energy may be computed as:

$$\Sigma(V_n * I_n)$$

A variety of arithmetic methods may be used to determine power, energy and phase relationships from the sampled current and voltage measurements.

Referring now to FIGS. 6A-6D, wire manager in accordance with other embodiments of the invention are shown. The wire manager of FIG. 6A includes a body portion 40A that may be affixed to a chassis with a fastener, such as a sheet metal screw or an electrical wiring socket, or body portion 40A may include an adhesive with a peel-off backing that may be removed from the underside of body portion 40A and the wire manager pressed to a chassis or other location. A sensor 42 is integrated in body portion 40A, and may be a single Hall effect device for measuring a net current through one or more wires secured by a wire-tie 44A that passes through body portion 40A, but may also include a voltage sensing element as in sensor 20 as described above. Interface wires 46 provide for connection of sensor 42 to a processing unit, which may receive input from multiple wire managers as shown in FIGS. 6A-6D in order to provide information about power usage by multiple power distribution branches in a manner similar to that employed in the power distribution system described above with reference to FIG. 1.

Figure 6A:
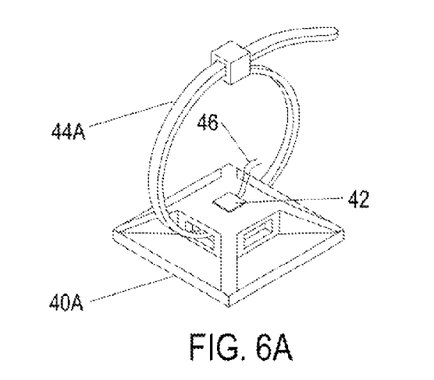
FIGS. 6A-6D are a pictorial diagrams depicting wire managers in accordance with alternative embodiments of the present invention.
Figure 6B:
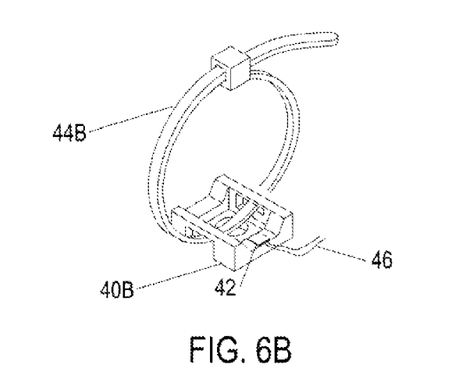
Figure 6C:
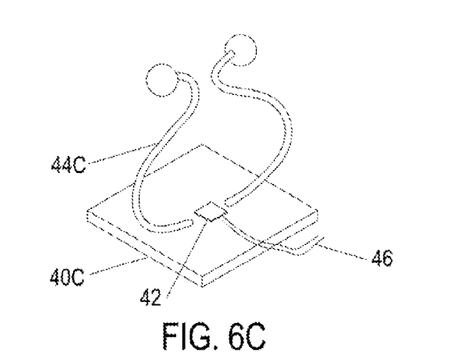
Figure 6D:
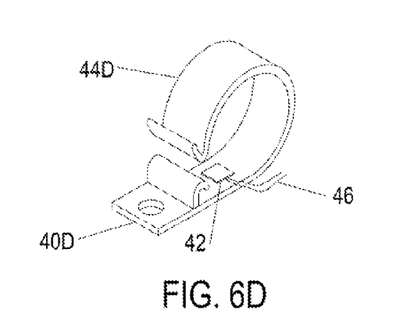

The wire managers of FIGS. 6B-6D are similar to the wire manager of FIG. 6A, so only differences between them will be described in further detail below. The wire manager of FIG. 6B includes a body portion 40B that is affixed to a chassis with a fastener, such as a sheet metal screw and also accepts a wire tie 44B for securing wires. Sensor 42 is positioned near an edge of body portion 40B, in order to provide access to the mounting area. The wire manager of FIG. 6C has integral twist-type securing extensions 44C that wrap around one or more wires, and sensor 42 is integrated adjacent to the union of securing extensions 44C with body portion 40C. The wire manager of FIG. 6D has an integral wire retaining strap formed as part of body portion 40D. In each of the above-described wire managers, sensor 42 is position so that sensor 42 will be proximate wires that are retained by the wire manager is securing the wires. Ferrite or other magnetic material can be used to form a loop around the wire by integrating the magnetic material in the wire manager body in a manner similar to the integration of ferrite pieces 24A, 24B in sensor 20 described above. Also, insert bushings as described above can be used around wires to provide for more uniform wire distance when voltage sensing is employed within sensor 42. The Hall effect sensors used in the above-described embodiments may be replaced by other current-sensing elements, with suitable changes to the sensor mechanical features. Examples of alternative current-sensing elements include current transformers. Rogowski coils, anisotropic magnetoresistance (AMR) elements, fluxgates, giant magnetoresistive (GMR) elements, fiberoptic current sensors, or any other non-contact current sensor.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method of measuring energy usage in a building power distribution system, the method comprising:
    installing a wire manager having a wire manager body within a raceway or panel of the building power distribution system;
    controlling a position of multiple wires corresponding to multiple branch circuits of the power distribution system by directing the multiple wires through the wire manager body, wherein the wire manager body defines a plurality of apertures along one side of the wire manager body through which individual corresponding ones of the multiple wires are inserted by the directing;
    isolating internal circuits of the wire manager from other circuits within the building power distribution system by installing a removable cover on the wire manager body;
    securing the multiple wires within corresponding ones of multiple current sensors affixed to a printed wiring board by closing clamshell housings of the multiple current sensors around individual corresponding ones of the multiple wires, wherein the printed wiring board is mounted in the wire manager body so that ends of individual ones of the multiple current sensors are positioned within corresponding ones of the apertures;
    measuring current in the multiple wires with current sensing elements integrated in the corresponding current sensors; and
    communicating results of the measuring to an external system that are indicative of energy usage within the building power distribution system.

2. The method of claim 1, wherein the measuring further comprises sensing electric potentials at each of the multiple wires using voltage sensing elements integrated in the sensors.

3. The method of claim 2, further comprising transmitting a result of the measuring to an external system from an interface integrated with the wire manager body.

4. The method of claim 3, wherein the interface is a circuit integrated on the printed wiring board.

5. The method of claim 1, further comprising transmitting a result of the measuring to an external system from an interface integrated with the wire manager body.

6. The method of claim 5, wherein the interface is a circuit integrated on the printed wiring board.

* * * * *